United States Patent
Kamada et al.

(10) Patent No.: US 6,599,675 B2
(45) Date of Patent: Jul. 29, 2003

(54) POLYIMIDES AND POLYAMIC ACIDS

(75) Inventors: Jun Kamada, Chiba (JP); Ken-ichi Goto, Chiba (JP); Takashi Kuroki, Chiba (JP); Shoji Tamai, Chiba (JP)

(73) Assignee: Mitsui Chemicals, Inc., Tokyo (JP)

( * ) Notice: Subject to any disclaimer, the term of this patent is extended or adjusted under 35 U.S.C. 154(b) by 34 days.

(21) Appl. No.: 10/018,368
(22) PCT Filed: Apr. 26, 2001
(86) PCT No.: PCT/JP01/03600
§ 371 (c)(1), (2), (4) Date: Dec. 19, 2001
(87) PCT Pub. No.: WO01/83591
PCT Pub. Date: Nov. 8, 2001

(65) Prior Publication Data
US 2002/0182536 A1 Dec. 5, 2002

(30) Foreign Application Priority Data

| Apr. 28, 2000 | (JP) | 2000-129786 |
| Dec. 8, 2000 | (JP) | 2000-373778 |
| Dec. 28, 2000 | (JP) | 2000-399897 |
| Mar. 30, 2001 | (JP) | 2001-100886 |
| Mar. 30, 2001 | (JP) | 2001-100887 |
| Mar. 30, 2001 | (JP) | 2001-100888 |

(51) Int. Cl.$^7$ ............... G03F 7/004; C08G 69/32
(52) U.S. Cl. ............... 430/270.1; 430/14; 430/907; 525/351; 525/353
(58) Field of Search ............... 430/270.1, 907, 430/14; 528/351, 353

(56) References Cited

U.S. PATENT DOCUMENTS

| 4,656,116 | A | * | 4/1987 | Rohde et al. ............... 430/197 |
| 4,826,927 | A | * | 5/1989 | Schmid et al. ............... 525/422 |
| 4,987,261 | A | | 1/1991 | Yamaguchi et al. |
| 5,137,751 | A | * | 8/1992 | Burgess et al. ............... 427/123 |
| 5,206,091 | A | * | 4/1993 | Beuhler et al. ............... 428/446 |
| 6,309,791 | B1 | * | 10/2001 | Hagiwara et al. ............... 430/270.1 |
| 6,340,546 | B1 | * | 1/2002 | Sasaki ............... 430/18 |
| 6,340,593 | B1 | * | 1/2002 | Cardineau et al. ............... 435/412 |

* cited by examiner

Primary Examiner—John S. Chu
(74) Attorney, Agent, or Firm—Burns, Doane, Swecker & Mathis, LLP

(57) ABSTRACT

A polyimide having a repeating unit of the general formula (I) and a polyamic acid having a repeating unit of the formula (IV):

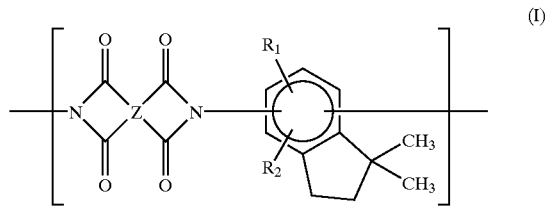

(I)

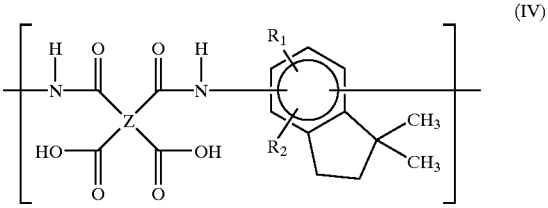

(IV)

(wherein, $R_1$ and $R_2$ represent H or a C1 to C20 alkyl group, and Z represents a condensed polycyclic aromatic group or an group of the following formulae:

-continued
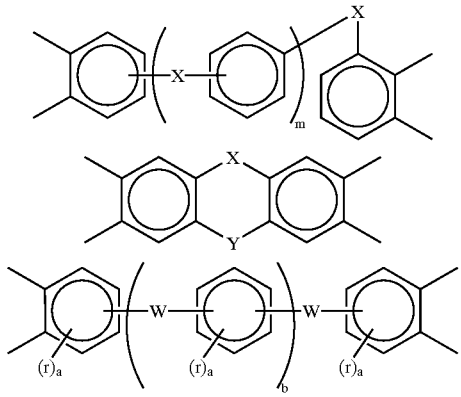
-continued
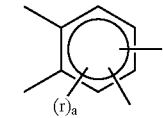
Herein, X represents —CO— or —C(=N$_2$)—, Y represents a direct bond, —CH$_2$—, —O—, —SO$_2$—, —S—, —CO— or —C(=N$_2$)—, and W represents a direct bond, —CH$_2$—, —C(CH$_3$)$_2$—, —C(CF$_3$)$_2$—, —S—, —SO—, —SO$_2$— or —O—, b, m and n are 0 or 1; r is a C1 to 4 alkyl group, halogen group or phenyl group; a is 0 or 1 to 3).
12 Claims, 2 Drawing Sheets

POLYIMIDES AND POLYAMIC ACIDS

TECHNICAL FIELD

The present invention relates to a novel polyimide and polyamic acid. More particularly, the present invention relates to a novel polyimide and polyamic acid excellent in heat resistance, mechanical properties and adhesion property, and additionally, manifesting high solvent solubility and low dielectric property, or photosensitivity of high sensitivity and high resolution. These polyimide and polyamic acid are very useful for the application of a photoresist, and very useful as an insulation film, particularly an insulation film used as a surface protective film and interlayer insulation film of a highly integrated semiconductor apparatus and highly integrated multi-layer wiring substrate.

BACKGROUND ART

Conventionally, a polyimide obtained by reacting a tetracarboxylic dianhydride with a diamine is used in fields of electric and electronic appliances, astronautic appliances, transport machines and the like since such a polyimide has excellent dynamical force and dimension stability and has flame retardancy, electric insulation property and the like simultaneously in addition to its high heat resistance, and expected to be used widely in fields for which heat resistance is required also in the future. Further, from the standpoint of requirement for remarkable expansion of electric and electronic appliances typified by recent computers and the like, polyimides are expected as high performance materials in may fields such as a surface protective film of a highly integrated semiconductor element, a sealing material, an interlayer insulation film of multi-layer wiring, a film-form substrate of a print wiring, and a protective film of a solar battery and the like, due to excellent heat resistance, electric property, mechanical strength and the like. Particularly, in an insulation film and a protective film of solid elements in the semiconductor industry, a polyimide resin is advantageous since it has excellent heat resistance and mechanical properties, and additionally, imparts flattening ability, processability, low dielectric property or photosensitivity and can provide a pattern forming ability.

Conventional technologies corresponding to polyimides having photosensitivity in the present invention are described in Japanese Patent Nos. 2125907 and 1976781. These are negative photosensitive polyimides having a hardening mechanism by a photo-crosslinking reaction between a benzophenone structure and an alkyl group in the skeleton (hereinafter, abbreviated as the present mechanism).

These conventional technologies specifically disclose polyimides obtained by reacting various diamines such as 4,4'-diamino-3,3',5,5'-tetramethyldiphenylmethane, 2,3,5,6-tetramethyl-1,4-phenylenediamine and the like with benzophenonetetracarboxylic dianhydride. These photosensitive polyimides show a tendency of increase in photosensitivity by increase in the alkyl group content in the molecule (POLYMER ENGINEERING AND SCIENCE, MID-NOVEMBER 1992, Vol. 32, No. 21, 1623 and later). This conventional technology also discloses photosensitive polyimides having high sensitivity and high alkyl group content in the molecule. However, under current conditions, when sensitivity is desired to be increased, a diamine unit having high alkyl group content has to be designed, leading inevitably to increase in production cost.

Further, claims in Japanese Patent No. 2125907 describe that a polyimide using diaminoindan as a diamine unit is included. This resembles the structure of polyimides of the present invention (polyimide using 1,1-dimethyldiaminoindans as a diamine unit). However, regarding this diaminoindan, a literature showing specifically a production method thereof is not found at all. As the production route, there is exemplified a method in which indene is first produced as a raw material, this is nitrated and reduced to introduce an amino group, or an aromatic ring is reduced by technologies disclosed in U.S. Pat. No. 3,875,228 and the like, and further, protection of an amino group, nitration, de-protection and reduction are effected to introducing a second amino group as disclosed in a production method of JP-A No. 9-504794. Thus, production of diaminoindan is supposed to be difficult since a lot of processes have to be conducted by combining various technologies.

Yamashita et al. have suggested a possibility of increase in photosensitivity of the resulted polyimide, by controlling steric conformation in the molecule in a photo-crosslinking reaction according to the above-mentioned mechanism (Shun Yamashita, "Recent Progress of Polyimide", 1992, 29 and later, 1993). This shows a possibility of increase in sensitivity by other method than the method of increasing a methyl group content in the molecule, namely, a possibility of producing a photosensitive polyimide having high sensitivity while suppressing cost for introduction of an alkyl group. However, regarding the photosensitive polyimide according to this mechanism disclosed in the above-mentioned conventional technology, it has been impossible to realize production at low cost by increasing photosensitivity conformationally to the maximum level.

On the whole, a photosensitive polyimide having high sensitivity and high resolution according to the present mechanism cannot be satisfactorily produced at low cost, and this cheap negative photosensitive polyimide having high sensitivity and high resolution has been desired to be developed.

On the other hand, JP-B No. 7-116112 reports a diaminoindan derivative together with its production method. This diaminoindan derivative is reported to be used as a raw material of isocyanates, epoxy resins, bismaleimides and the like or as a hardening agent for isocyanates or a modifier for various resins and rubbers. However, it has not been known heretofore at all that this diaminoindan derivative is useful as a monomer for polyimides and the resultant various polyimides have excellent photosensitivity and show remarkably high solvent solubility.

DISCLOSURE OF THE INVENTION

An object of the present invention is to provide a novel polyimide and polyamic acid excellent in heat resistance, mechanical properties and adhesion property, and additionally, manifesting high solvent solubility and low dielectric property, or photosensitivity of high sensitivity and high resolution, wherein the polyimide and polyamic acid being useful in uses such as a photoresist, an insulation film and the like, for example.

The present inventors have intensively studied and resultantly, synthesized a novel polyimide and a novel polyamic acid having a 1,1-dimethylindan skeleton in a repeating structure and found that this polyimide or polyamic acid has excellent photosensitivity and shows dielectric property and remarkably high solvent solubility, leading to completion of the present invention.

Namely, the present invention provides a polyimide having a repeating unit of the following general formula (I):

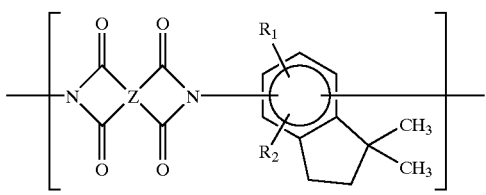

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

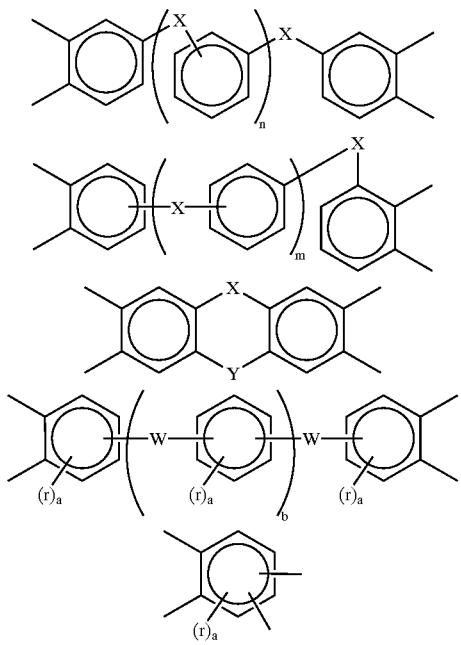

Herein, X represents —CO— or —C(=$N_2$)—, Y represents a direct bond, —$CH_2$—, —O—, —$SO_2$—, —S—, —CO— or —C(=$N_2$)—, and W represents a direct bond, —$CH_2$—, —C($CH_3$)$_2$—, —C($CF_3$)$_2$—, —S—, —SO—, —$SO_2$— or —O—. b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3.).

Further, the present invention provides a method of producing a polyimide having a repeating unit of the above-mentioned general formula (I) wherein the method uses a diaminoindan derivative of the following general formula (II) and an aromatic tetracarboxylic dianhydride of the following general formula (III) as monomers.

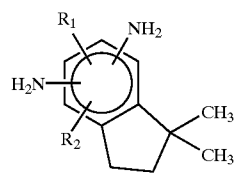

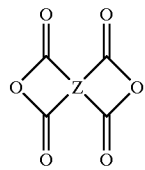

Further, the present invention provides a polyamic acid having a repeating unit of the following general formula (IV):

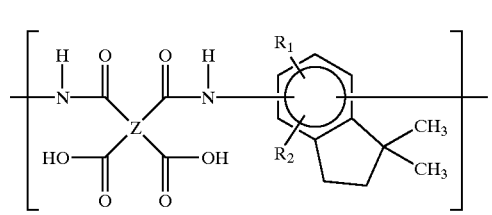

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

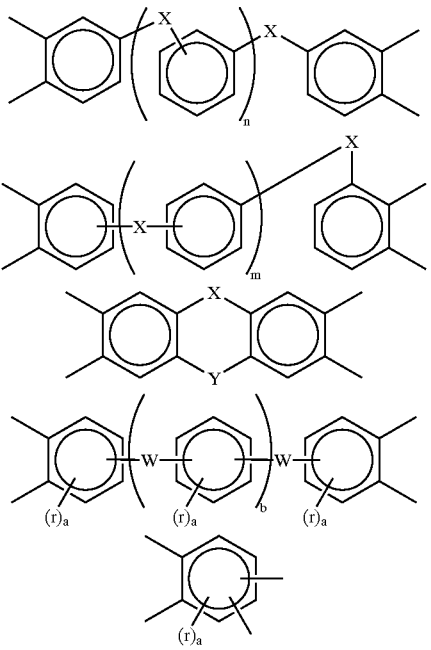

Herein, X represents —CO— or —C(=$N_2$)—, Y represents a direct bond, —$CH_2$—, —O—, —$SO_2$—, —S—, —CO— or —C(=$N_2$)—, and W represents a direct bond, —$CH_2$—, —C($CH_3$)$_2$—, —C($CF_3$)$_2$—, —S—, —SO—, —$SO_2$— or —O—. b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3.).

Further, the present invention provides a method of producing a polyamic acid having a repeating unit of the above-mentioned general formula (IV) wherein the method uses a diaminoindan derivative of the above-mentioned general formula (II) and an aromatic tetracarboxylic dianhydride of the above-mentioned general formula (III) as monomers.

Further, the present invention provides a polyimide wherein when the optimum stabilized structure is calculated based on theoretical calculation, the absolute value |α| of the dihedral angle α is in the range from 82° to 98° in a repeating unit structure contained in the molecule (herein, α is a dihedral angle formed by four adjacent atoms, C(carbonyl carbon of imide)-N(nitrogen of imide)-C—C, and defined in the range from −180° to 180°.).

BEST MODES FOR CARRYING OUT THE INVENTION

Figure 1:
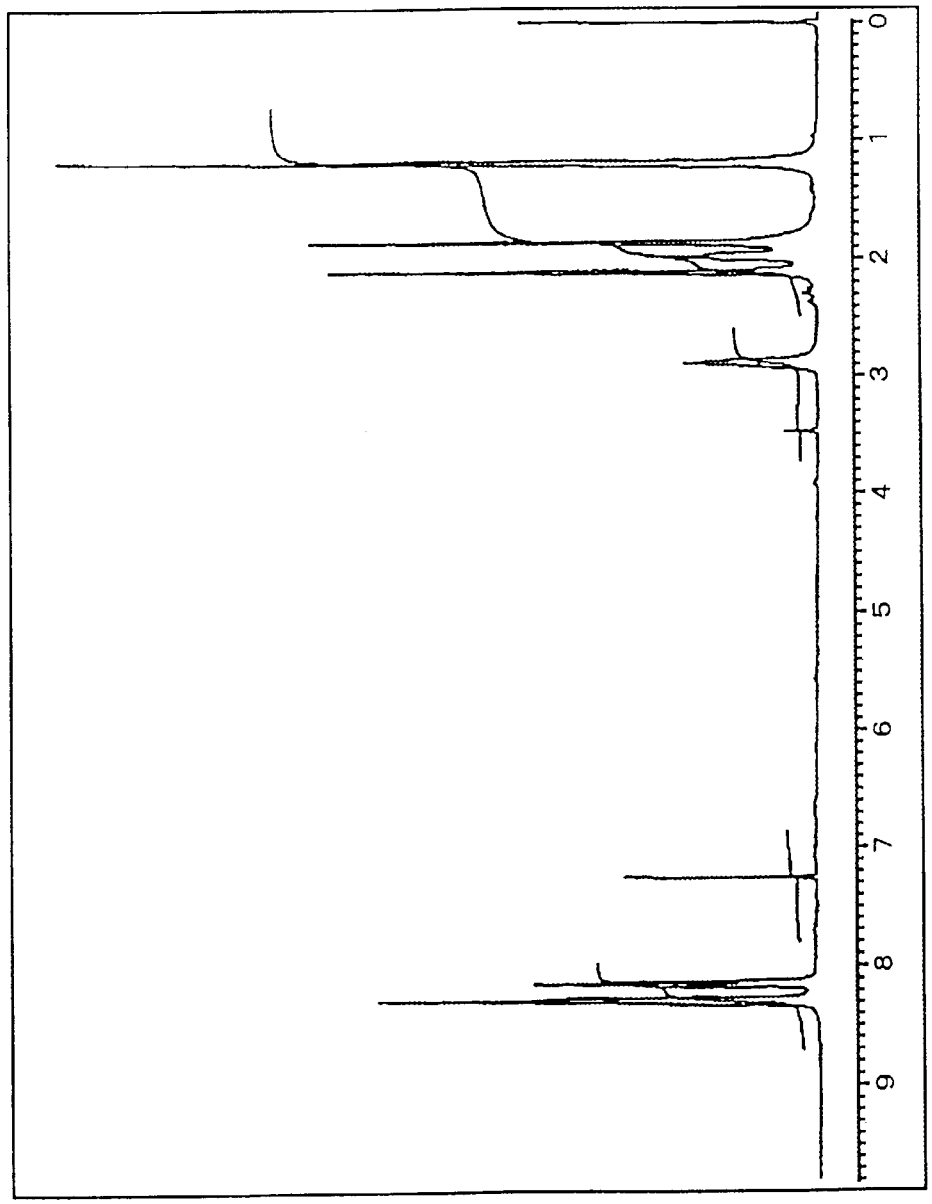
FIG. 1 shows a $^1$H-NMR spectrum of a novel polyimide of Example 1.

In general formulae (I) and (IV), $R_1$ and $R_2$ each independently represent a hydrogen atom or an alkyl group having 1 to 20 carbon atoms. Of them, alkyl groups having 1 to 20 carbon atoms are preferable, alkyl groups having 1 to 10 carbon atoms are more preferable, and alkyl groups having 1 to 5 carbon atoms are particularly preferable. Specifically, a methyl group, isopropyl group and the like are preferable. The position of $R_1$ and $R_2$ on a 1,1-dimethylindan skeleton is not particularly restricted. Particularly, however, polyimides in which both of $R_1$ and $R_2$ are bonded to any of 4-, 5- and 6-positions on a 1,1-dimethylindan skeleton in the general formula (I) are preferable due to high solvent solubility.

Further, polyimides in which both of $R_1$ and $R_2$ are bonded to any of 4-, 5- and 6-positions on a 1,1-dimethylindan skeleton and Z has a benzophenone structure in the general formula (I) are preferable since they have high solvent solubility and manifest photosensitivity of high sensitivity.

Further, polyimides in which both of $R_1$ and $R_2$ are a methyl group, and these methyl groups are bonded to 4- and 6-positions on a 1,1-dimethylindan skeleton and Z has a benzophenone structure in the general formula (I), namely, polyimides having a repeating unit structure of the following formula (V) are preferable since they have high solvent solubility and manifest photosensitivity of high sensitivity.

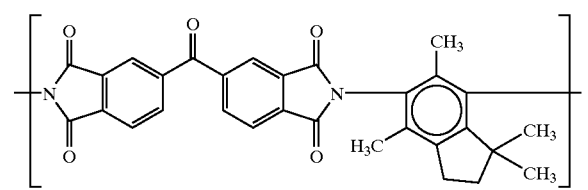

(V)

In the formulae represented by Z in the general formulae (I) and (IV), X represents —CO— or —C(=N$_2$)—, Y represents a direct bond, —CH$_2$—, —O—, —SO$_2$—, —S—, —CO— or —C(=N$_2$)—, and they are not particularly restricted providing such conditions are satisfied.

Furthermore, polyimides in which both of $R_1$ and $R_2$ are bonded to any of 4-, 5- and 6-positions on a 1,1-dimethylindan skeleton and simultaneously X is —CO— or C(=N$_2$)— in the general formula (I) are preferable since they have high solvent solubility and manifest photosensitivity of high sensitivity.

Still further, polyimides in which both of $R_1$ and $R_2$ are bonded to any of 4-, 5- and 6-positions on a 1,1-dimethylindan skeleton and simultaneously X is —CO— or C(=N$_2$)— and Y is —CO— or C(=N$_2$)— or S— in the general formula (I) are preferable since they have high solvent solubility and manifest photosensitivity of high sensitivity.

Particularly, polyimides in which both of $R_1$ and $R_2$ are a methyl group, and these methyl groups are bonded to 4- and 6-positions on a 1,1-dimethylindan skeleton and Z has a structure produced from 2,2-bis(3,4-dicarboxyphenyl)-1,1, 1,3,3,3-hexafluoropropane dianhydride in the general formula (I), namely, polyimides having a repeating unit structure of the following formula (VI) are preferable since they have high solvent solubility and low dielectric property.

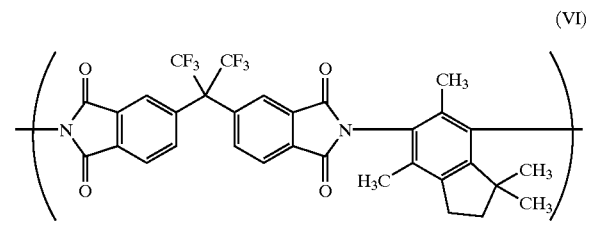

(VI)

As shown in the above-described literature of Yamashita et al. (Shun Yamashita, "Recent Progress of Polyimide", 1992, 29 and later, 1993), in photosensitive polyimides showing a hardening mechanism by a photo-crosslinking reaction between a benzophenone structure and an alkyl group in the skeleton, charge transfer in the molecule leads to deactivation of the photo-crosslinking reaction. Therefore, it is extremely important to suppress this charge transfer in the molecule, for increasing sensitivity of a photosensitive polyimide.

The present inventors have found that, for suppressing the above-mentioned charge transfer in the molecule, a polyimide in which molecular design is so conducted that an angle formed by a plane of an imide ring and a plane of an aromatic ring connected to a nitrogen atom of the imide ring is in the specific range [near right angle (90°)] performs a very excellent effect. Namely, the polyimide of the present invention is characterized in that when the optimum stabilized structure is calculated based on theoretical calculation, the absolute value |α| of an angle α formed by a plane of an imide ring and a plane of an aromatic ring connected to a nitrogen atom of the imide ring (hereinafter, abbreviated as dihedral angle) is in the range from 82° to 98°. For suppressing charge transfer in the molecule of a polyimide, one method is exemplified in which a bulky substituent is introduced into a diamine to suppress the steric conformation of a C—N bond of the imide. The polyimide having a repeating unit of the general formula (I) is a very suitable polymer for satisfying such an absolute value |α| of a dihedral angle, in which charge transfer in the molecular is suppressed by introducing a bulky substituent into a diamine and forming a steric structure having large dihedral angle, to attain increase in a photosensitive ability.

As the theoretical calculation method, for example, a quantum mechanics method and molecular dynamics method are listed. As the quantum mechanics method, semi-empirical calculation methods typically including AM1 and PM3, extension Huckel, MINDO/3, MNDO, MNDO-d, and an ab initio method are exemplified. As the molecular dynamics method, MMS is exemplified. For the purpose of obtaining efficiency of calculation and the like, two or more calculation methods can be used together. Specifically, a structure in which a molecular model is optimized by a molecular dynamics methods may be further optimized by using a quantum mechanics method. For example, a method of producing a molecular model as used in examples described below is effective.

Here, the dihedral angle is an angle formed by two planes constituted of an array of 4 atoms. When the second and third atoms of these 4 atoms are placed on the X axis and the first atom is placed on a Z-X plane, the dihedral angle is obtained by projecting the first, second and forth atoms onto a X-Y plane and measuring the angle. Expression of the mark of the dihedral angle is not restricted in the present invention.

The polyimide of the present invention is not limited in its chemical structure providing the above-mentioned absolute value $|\alpha|$ of the dihedral angle $\alpha$ is in the range from 82° to 98°. Further, the absolute value $|\alpha|$ of the dihedral angle $\alpha$ is preferably 84° or more and 96 20 or less, more preferably 85° or more and 95° or less, particularly preferably 89° or more and 91° or less.

The logarithmic viscosity of a polyimide of the present invention is not particularly restricted, and generally from 0.1 to 2.0, preferably from 0.2 to 1.9, more preferably from 0.3 to 1.8, particularly preferably from 0.4 to 1.7, and optimally from 0.5 to 1.6. When the logarithmic viscosity of a polyimide is too low, it is general that the strength and toughness of a product after processing lower, undesirably. When the logarithmic viscosity of a polyimide is too high, it is general that processability in producing a product deteriorates, undesirably. A method of evaluating the logarithmic viscosity of a polyimide is not particularly restricted, and for example, it can be measured at 35° C. after dissolving 0.50 g of a polyimide powder into 100 ml of N-methyl-2-pyrrolidone.

The polyimide of the present invention may also be one obtained by copolymerizing various diamines and tetracarboxylic dianhydrides, if necessary, in addition to a repeating unit component having a structure of the general formula (I), for the purpose of controlling various physical properties, for example, heat resistance, hygroscopic property, thermal expansion coefficient, dielectric constant, refractive index, birefringence and the like.

The polyimide of the present invention may be one produced by any method. However, the method of producing a polyimide of the present invention is characterized in that it uses a diaminoindan derivative of the general formula (II) and an aromatic tetracarboxylic dianhydride of the general formula (III) as monomers.

The diaminoindan derivative of the general formula (II) is not particularly restricted, and examples thereof include 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, 5,7-diamino-1,1-dimethyl-6-ethylindan, 5,7-diamino-1,1-dimethyl-4-isopropylindan, 5,7-diamino-1,1-dimethyl-6-isopropylindan, 5,7-diamino-1,1-dimethyl-4-n-propylindan, 5,7-diamino-1,1-dimethyl-6-n-propylindan, 5,7-diamino-1,1-dimethyl-4-sec-butylindan, 5,7-diamino-1,1-dimethyl-6-sec-butylindan, 5,7-diamino-1,1-dimethyl-4-n-butylindan, 5,7-diamino-1,1-dimethyl-6-n-butylindan, 5,7-diamino-1,1-dimethyl-4-tert-butylindan, 5,7-diamino-1,1-dimethyl-6-tert-butylindan, 5,7-diamino-1,1,4,6-tetramethylindan, 6,7-diamino-1,1,4,5-tetramethylindan, 4,7-diamino-1,1,5,6-tetramethylindan, 5,7-diamino-1,1-dimethyl-4,6-diethylindan, 5,7-diamino-1,1-dimethyl-4,6-diisopropylindan, 5,7-diamino-1,1,4-trimethyl-6-tert-butylindan and the like. These diaminoindan derivatives can be used alone or in admixture, according to demands.

Methods of producing a diaminoindan derivative of the general formula (II) is described in JP-A No. 64-50848, and the like. Namely, it is possible to synthesize an indan derivative by a reaction of a benzene derivative and isoprene, and nitrate and reduce this derivative to produce a diaminoindan derivative at low cost.

The aromatic tetracarboxylic dianhydride of the general formula (III) is not particularly restricted, and examples thereof include pyromellitic dianhydride, 3,3',4,4'-biphenyltetracarboxylic dianhydride, 3,3',4,4'-benzophenone-tetracarboxylic dianhydride, bis(3,4-dicarboxyphenyl) ether dianhydride, bis(3,4-dicarboxyphenyl) sulfide dianhydride, bis(3,4-dicarboxyphenyl) sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic dianhydride, 1,4,5,8-naphthalenetetracarboxylic dianhydride, 2,2',3,3'-benzophenonetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl) ether dianhydride, bis(2,3-dicarboxyphenyl) sulfide dianhydride, bis-(2,3-dicarboxyphenyl) sulfone dianhydride, 1,3-bis(2,3-dicarboxyphenoxy)benzene dianhydride, 1,4-bis(2,3-dicarboxyphenoxy)benzene dianhydride, 1,2,5,6-naphthalenetetracarboxylic dianhydride, 1,3-bis(3,4-dicarboxybenzoyl)-benzene dianhydride, 1,4-bis(3,4-dicarboxybenzoyl)benzene dianhydride, 1,3-bis(2,3-dicarboxybenzoyl)benzene dianhydride, 1,4-bis(2,3-dicarboxybenzoyl)benzene dianhydride, 4,4'-isophthaloyldiphthalic anhydride, diazodiphenylmethane-3,3',4,4'-tetracarboxylic dianhydride, diazodiphenylmethane-2,2',3,3'-tetracarboxylic dianhydride, 2,3,6,7-thioxanetonetetracarboxylic dianhydride, 2,3,6,7-anthraquinonetetracarboxylic dianhydride, 2,3,6,7-xanthonetetracarboxylic dianhydride, and the like. These aromatic tetracarboxylic dianhydrides can be used alone or in admixture depending on demands.

The method of producing a polyimide of the present invention is particularly preferably a method in which a diaminoindan in which both of $R_1$ and $R_2$ are a methyl group, and these methyl groups are bonded to 4- and 6-positions on a 1,1-dimethylindan skeleton in the general formula (II), namely 5,7-diamino-1,1,4,6-tetramethylindan of the following formula (VII), and benzophenonetetracarboxylic dianhydride as an aromatic tetracarboxylic dianhydride of the general formula (II), are used.

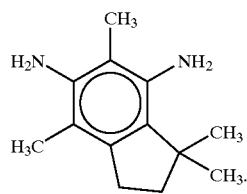

(VII)

In producing a polyimide of the present invention, other various diamines and tetracarboxylic dianhydrides can be used as monomers, in addition to a diaminoindan derivative of the general formula (II) and an aromatic tetracarboxylic dianhydride of the general formula (III), and copolymerized.

The diamine component used in copolymerization is not particularly restricted, and examples thereof include the following compounds.

a) Compounds Having One Benzene Ring p-phenylenediamine, m-phenylenediamine b) Compounds Having Two Benzene Rings 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane c) Compounds Having Three Benzene Rings 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)-benzene, 1,4-bis(4-amino-α,α-dimethylbenzyl)benzene, 1,3-bis(3-amino-α,α-ditrifluoromethylbenzyl)benzene, 1,3-bis-(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine d) Compounds Having four Benzene Rings 4,4'-bis(3-aminophenoxy)biphenyl, 4,4'-bis(4-aminophenoxy)biphenyl, bis[4-(3-aminophenoxy)phenyl] ketone, bis[4-(4-aminophenoxy)phenyl] ketone, bis[4-(3-aminophenoxy)phenyl] sulfide, bis[4-(4-aminophenoxy)phenyl] sulfide, bis[4-(3-aminophenoxy)phenyl] sulfone, bis[4-(4-aminophenoxy)phenyl] sulfone, bis[4-(3-aminophenoxy)phenyl] ether, bis[4-(4-aminophenoxy)phenyl] ether, 2,2-bis[4-(3-aminophenoxy)phenyl]propane, 2,2-bis[4-(4-amino-phenoxy)-phenyl]propane, 2,2-bis[3-(3-aminophenoxy)phenyl]-1,1,1,3,3,3-hexafluoropropane, 2,2-bis[4-(4-aminophenoxy)-phenyl]-1,1,1,3,3,3-hexafluoropropane e) Compounds Having Five Benzene Rings 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)-benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene f) Compounds Having Six Benzene Rings 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]-diphenylsulfone, 4,4'-bis[4-(4-aminophenoxy)phenoxy]-diphenylsulfone g) Compounds Having an Aromatic Substituent 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone h) Compounds Having a Spirobiindan Ring 6,6'-bis(3-aminophenoxy)-3,3,3',3'-tetramethyl-1,1'-spirobiindan, 6,6'-bis(4-aminophenoxy)-3,3,3',3'-tetramethyl-1,1'-spirobiindan i) Siloxanediamines 1,3-bis(3-aminopropyl)tetramethyldisiloxane, 1,3-bis(4-aminobutyl)tetramethyldisiloxane, α,ω-bis(3-aminopropyl)-polydimethylsiloxane, α,ω-bis(3-aminobutyl) polydimethylsiloxane j) Ethylene Glycol Diamines bis(aminomethyl) ether, bis(2-aminoethyl) ether, bis(3-aminopropyl) ether, bis(2-aminomethoxy)ethyl] ether, bis[2-(2-aminoethoxy)ethyl] ether, bis[2-(3-aminopropoxy)ethyl] ether, 1,2-bis(amino methoxy)ethane, 1,2-bis(2-aminoethoxy)ethane, 1,2-bis[2-(aminomethoxy)ethoxy]ethane, 1,2-bis[2-(2-aminomethoxy)ethoxy]ethane, ethylene glycol bis(3-aminopropyl) ether, diethylene glycol bis(3-aminopropyl) ether, triethylene glycol bis(3-aminopropyl) ether k) Methylenediamines ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane l) Alicyclic Diamines 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2,2,1]heptane, 2,5-bis(aminomethyl)bicyclo-[2,2,1]heptane Further, diamines obtained by substituting part or all of hydrogen atoms on an aromatic ring of the above-mentioned diamines with a fluoro group, methyl group, methoxy group, trifluoromethyl group or trifluoromethoxy group, and other diamines can be used. Further, an ethynyl group, benzocyclobuten-4'-yl group, vinyl group, allyl group, cyano group, isocyanate group, nitrilo group or isopropenyl group acting as a crosslinking point can also be introduced as a substituent into part or all of hydrogen atoms on an aromatic ring of the above-mentioned diamines, depending on objects. Furthermore, a vinylene group, vinylidene group or ethynylidene group can also be incorporated, not as a substituent, into the main chain skeleton, depending on objects. Further, part of diamines may also be substituted by triamines or tetraamines, for the purpose of introducing branching. These diamines can be used alone or in admixture, depending on demands.

As the tetracarboxylic dianhydride components used for copolymerization, aliphatic tetracarboxylic dianhydrides such as ethylenetetracarboxylic dianhydride, butanetetracarboxylic dianhydride, cyclopentanetetracarboxylic dianhydride and the like are listed, in addition to the above-mentioned aromatic tetracarboxylic dianhydrides.

Also, aromatic tetracarboxylic dianhydrides obtained by substituting part or all of hydrogen atoms on an aromatic ring of aromatic tetracarboxylic dianhydrides by a fluoro group, methyl group, methoxy group, trifluoromethyl group or trifluoromethoxy group can be used. Further, an ethynyl group, benzocyclobuten-4'-yl group, vinyl group, allyl group, cyano group, isocyanate group, nitrilo group or isopropenyl group acting as a crosslinking point can also be introduced as a substituent into part or all of hydrogen atoms on an aromatic ring of aromatic tetracarboxylic dianhydrides, depending on objects. Furthermore, a vinylene group, vinylidene group or ethynylidene group can also be incorporated, not as a substituent, into the main chain skeleton, preferably to an extent causing no deterioration of molding processability. Further, part of tetracarboxylic dianhydrides may also be substituted by hexacarboxylic trianhydrides or octacarboxylic tetraanhydrides, for the purpose of introducing branching. These aromatic tetracarboxylic dianhydrides can be used alone or in admixture, depending on demands.

The method of producing a polyimide of the present invention can be carried out even without using a solvent, and particularly preferably, a reaction is conducted in an organic solvent. The solvent used in this reaction is not particularly restricted, and examples thereof include the following solvents.

(a) Phenol-based Solvents phenol, o-chlorophenol, m-chlorophenol, p-chlorophenol, o-cresol, m-cresol, p-cresol, 2,3-xylenol, 2,4-xylenol, 2,5-xylenol, 2,6-xylenol, 3,4-xylenol, 3,5-xylenol (b) Aprotic Amide-based Solvents N,N-dimethylformamide, N,N-dimethylacetamide, N,N-diethylacetamide, N-methyl-2-pyrrolidone, 1,3-dimethyl-2-imidazolidinone, N-methylcaprolactam, hexamethylphosphorotriamide (c) Ether-based Solvents 1,2-diemthoxyethane, bis(2-methoxyethyl) ether, 1,2-bis(2-methoxyethoxy)ethane, tetrahydrofuran, bis[2-(2-methoxyethoxy)ethyl] ether, 1,4-dioxane (d) Amine-based Solvents pyridine, quinoline, isoquinoline, α-picoline, β-picoline, γ-picoline, isophorone, piperidine, 2,4-lutidine, 2,6-lutidine, trimethylamine, triethylamine, tripropylamine, tributylamine (e) Other Solvents dimethylsulfoxide, dimethylsulfone, diphenyl ether, sulfolane, diphenylsulfone, tetramethylurea, anisole, water, benzene, toluene, o-xylene, m-xylene, p-xylene, chlorobenzene, o-dichlorobenzene, m-dichlorobenzene, p-dichlorobenzene, bromobenzene, o-dibromobenzene, m-dibromonenzene, p-dibromobenzene, o-chlorotoluene, m-chlorotoluene, p-chlorotoluene, o-bromotoluene, m-bromotoluene, p-bromotoluene, acetone, methyl ethyl ketone, methyl isobutyl ketone, cyclopentanone, cyclohexanone, methanol, ethanol, propanol, isopropanol, butanol, isobutanol, pentane, hexane, heptane, cyclohexane, dichloromethane, chloroform, carbon tetrachloride, fluorobenzene, methyl acetate, ethyl acetate, butyl acetate, methyl formate, ethyl formate These solvents may be used alone or in admixture without problem.

In the method of producing a polyimide of the present invention, an terminator can be used, if necessary. This terminator is not particularly restricted. As typical examples, monoamines and dicarboxylic anhydrides are listed.

Examples of the monoamines include aniline, o-toluidine, m-toluidine, p-toluidine, 2,3-xylidine, 2,4-xylidine, 2,5-xylidine, 2,6-xylidine, 3,4-xylidine, 3,5-xylidine, o-chloroaniline, m-chloroaniline, p-chloroaniline, o-bromoaniline, m-bromoaniline, p-bromoaniline, o-nitroaniline, m-nitroaniline, p-nitroaniline, o-anisidine, m-anisidine, p-anisidine, p-phenetidine, m-phenetidine, p-phenetidine, o-aminophenol, m-aminophenol, p-aminophenol, o-aminobenzaldehyde, m-aminobenzaldehyde, p-aminobenzaldehyde, o-aminobenzonitrile, m-aminobenzonitrile, p-aminobenzonitrile, 2-aminobiphenyl, 3-aminobiphenyl, 4-aminobiphenyl, 2-aminopheny phenyl ether, 3-aminophenyl phenyl ether, 4-aminophenyl phenyl ether, 2-aminobenzophenone, 3-aminobenzophenone, 4-aminobenzophenone, 2-aminophenyl phenyl sulfide, 3-aminophenyl phenyl sulfide, 4-aminophenyl phenyl sulfide, 2-aminophenyl phenyl sulfone, 3-aminophenyl phenyl sulfone, 4-aminophenyl phenyl sulfone, α-naphthylamine, β-naphthylamine, 1-amino-2-naphthol, 2-amino-1-naphthol, 4-amino-1-naphthol, 5-amino-1-naphthol, 5-amino-2-naphthol, 7-amino-2-naphthol, 8-amino-1-naphthol, 8-amino-2-naphthol, 1-aminoanthracene, 2-aminoanthracene, 9-aminoanthracene, methylamine, dimethylamine, ethylamine, diethylamine, propylamine, dipropylamine, isopropylamine, diisopropylamine, butylamine, dibutylamine, isobutylamine, diisobutylamine, pentylamine, dipentylamine, benzylamine, cyclopropylamine, cyclobutylamine, cyclopentylamine, cyclohexylamine and the like.

Examples of the dicarboxylic anhydride include phthalic anhydride, 2,3-benzophenonedicarboxylic anhydride, 3,4-benzophenonedicarboxylic anhydride, 2,3-dicarboxyphenyl ether anhydride, 3,4-dicarboxyphenyl phenyl ether anhydride, 2,3-biphenyldicarboxylic anhydride, 3,4-biphenyldicarboxylic anhydride, 2,3-dicarboxyphenyl phenol sulfone anhydride, 3,4-dicarboxyphenyl phenyl sulfone anhydride, 2,3-dicarboxyphenyl phenyl sulfide anhydride, 3,4-dicarboxyphenyl phenyl sulfide anhydride, 1,2-naphthalene-dicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride, 1,9-anthracenedicarboxylic anhydride, and the like.

These monoamines and dicarboxylic anhydrides may be partially substituted with a group having no reactivity with an amine or dicarboxylic anhydride, without problem.

In the method of producing a polyimide of the present invention, a catalyst can be used together. For example, the method can be effected in the co-presence of a basic catalyst. Specifically, there are listed various amine-based solvents described in the above-mentioned (d), organic bases such as imidazole, N,N-dimethylaniline, N,N-diethylaniline and the like, and inorganic bases typified by potassium hydroxide, sodium hydroxide, potassium carbonate, sodium carbonate, potassium hydrogen carbonate and sodium hydrogen carbonate.

In the method of producing a polyimide of the present invention, the polymerization temperature and polymerization time vary depending on the presence or absence and the kind of solvents and catalysts used, and it is generally sufficient that the polymerization temperature is 25° C. to 250° C. and the polymerization time is 1 to 24 hours.

Further, when polyimide of the present invention is produced in the form of a polyimide film, a method in which varnish of a polyamic acid is applied on a glass plate, then, heated for imidation, and a method in which a film is formed by directly heating and pressing a polyimide powder, described later, are possible. Since the polyimide of the present invention shows extremely high solubility in a general-purpose organic solvent, it is also possible that a polyimide powder is dissolved in an organic solvent, then, the solution is applied on a glass plate, and de-solvented to produce a film. The general-purpose organic solvent herein used is not particularly restricted, and there are exemplified solvents (a) to (e) listed previously as those which can be used in the method of producing a polyimide.

The polyamic acid of the present invention has a repeating unit of the general formula (IV). Particularly, a polyamic acid in which both of $R_1$ and $R_2$ are bonded to any of 4-, 5- and 6-positions on a 1,1-dimethylindan skeleton in the general formula (IV) is preferable due to high solvent solubility.

Further, a polyamic acid in which both of $R_1$ and $R_2$ are a methyl group, and these methyl groups are bonded to 4- and 6-positions on a 1,1-dimethylindan skeleton and Z has a benzophenone structure in the general formula (IV), namely, a polyamic acid having a repeating unit structure of the following formula (VIII) is preferable since it has high solvent solubility and manifests photosensitivity of high sensitivity.

solution using N-methyl-2-pyrrolidone as a solvent. Concentration: 20 wt %) into 100 ml of N-methyl-2-pyrrolidone.

The polyamic acid of the present invention may also be one obtained by copolymerizing various diamines and tetracarboxylic dianhydrides, if necessary, in addition to a repeating unit component having a structure of the general formula (IV), for the purpose of controlling various physical properties, for example, heat resistance, hygroscopic property, thermal expansion coefficient, dielectric constant, refractive index, birefringence and the like.

The polyamic acid of the present invention may be one produced by any method. However, the method of producing a polyamic acid of the present invention is characterized in that it uses a diaminoindan derivative of the general formula (II) and an aromatic tetracarboxylic dianhydride of the general formula (III) as monomers. Specific examples of the diaminoindan derivative of the general formula (II) are as described above.

Further, a method in which a diaminoindan in which both of $R_1$ and $R_2$ are a methyl group, and these methyl groups are bonded to 4- and 6-positions on a 1,1-dimethylindan skeleton in the general formula (II), namely 5,7-diamino-1, 1,4,6-tetramethylindan of the above-mentioned formula (VII), and an aromatic tetracarboxylic dianhydride of the general formula (III), are used, is preferable.

In producing a polyamic acid of the present invention, other various diamines and tetracarboxylic dianhydrides can be used as monomers, in addition to a diaminoindan deriva-

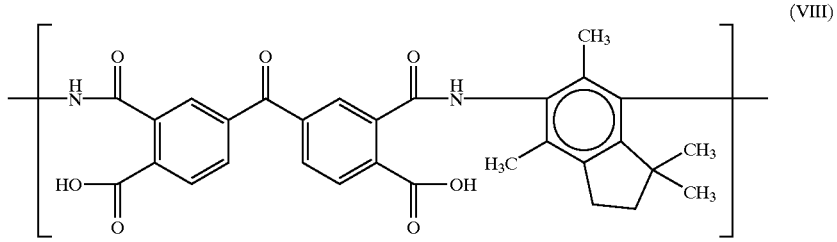

(VIII)

Furthermore, a polyamic acid in which both of $R_1$ and $R_2$ are bonded to any of 4-, 5- and 6-positions on a 1,1-dimethylindan skeleton in the general formula (IV) and simultaneously X in the general formula (IV) is —CO— or C(=N$_2$)— is preferable since it has high solvent solubility and manifests photosensitivity of high sensitivity.

Still further, a polyimide in which both of $R_1$ and $R_2$ are bonded to any of 4-, 5- and 6-positions on a 1,1-dimethylindan skeleton in the general formula (IV) and simultaneously X is —CO— or C(=N$_2$)— and Y is —CO— or C(=N$_2$)— or S— in the general formula (IV) are preferable since it has high solvent solubility and manifests photosensitivity of high sensitivity.

The logarithmic viscosity of a polyamic acid of the present invention is not particularly restricted, and generally from 0.1 to 2.0, preferably from 0.2 to 1.9, more preferably from 0.3 to 1.8, particularly preferably from 0.4 to 1.7, and optimally from 0.5 to 1.6. when the logarithmic viscosity of a polyamic acid is too low, it is general that the strength and toughness of a product after processing lower, undesirably. When the logarithmic viscosity of a polyamic acid is too high, it is general that processability in producing a product deteriorates, undesirably. A method of evaluating the logarithmic viscosity of a polyamic acid is not particularly restricted, and for example, it can be measured at 35° C. after dissolving 2.50 g of polyamic acid varnish (A polyamic acid tive of the general formula (II) and an aromatic tetracarboxylic dianhydride of the general formula (III), and copolymerized.

The diamine component and tetracarboxylic dianhydride component used in copolymerization are not particularly restricted, and diamines and tetracarboxylic dianhydrides described above used in copolymerization of a polyimide are listed likewise. Further, part of diamines may also be substituted by triamines or tetraamines, and part of tetracarboxylic dianhydrides may be substituted by hexacarboxylic trianhydrides or octacarboxylic tetraanhydrides, for the purpose of introducing branching.

In the method of producing a polyamic acid of the present invention, solvents, terminators and catalysts are as described above for copolymerization of a polyimide.

In the method of producing a polyamic acid of the present invention, the polymerization temperature and polymerization time vary depending on the presence or absence and the kind of solvents and catalysts used, and it is generally sufficient that the polymerization temperature is 0° C. to 100° C. and the polymerization time is 1 to 24 hours.

The novel photosensitive polyimide and polyamic acid of the present invention can be widely used as a photoresist in the regions of electronics, paints, printing ink, printing plates, adhesives and the like, typically including an interlayer insulation film and surface protective film of semiconductor elements, thin film devices and the like.

The photoresist of the present invention contains any one or both of a polyimide having a repeating unit of the general formula (I) and a polyamic acid having a repeating unit of the general formula (IV), as composition components. Here, the photoresist means a substance which forms a hard film having chemical resistance, particularly insolubility, by light exposure.

The photoresist of the present invention may contain any other components, for example, a sensitizer, light polymerization initiator, monomer, oligomer, stabilizer, wetting agent, fluidizer, pigment, dye, adhesion accelerator and the like, depending on the object, as composition components, in addition to the polyimide and polyamic acid of the present invention. The photoresist of the present invention is extremely useful in the regions of electronics, paints, printing ink, printing plates, adhesives and the like, typically including an interlayer insulation film and surface protective film of semiconductor elements, thin film devices and the like.

The insulation film of the present invention is an insulation film made of a polyimide in which Z in the general formula (I) is

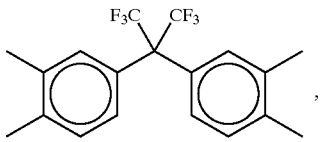

, among polyimides of the present invention. This insulation film can be applied to any film forming method conventionally known. For example, a method in which varnish of a polyamic acid which is a precursor of the polyimide of the present invention is applied on a desired substrate, then, heated for imidation, and a method in which a film is formed by directly heating and pressing a polyimide powder, are possible. Further, it is also possible that a polyimide of the present invention is dissolved in a general-purpose organic solvent, then, the solution is applied on a substrate, and de-solvented to produce a film.

The multi-layer wiring substrate of the present invention is a wiring substrate having the insulation film of the present invention as a interlayer insulation film. For producing this multi-layer wiring substrate, conventionally known methods can be applied. Specifically, it can be produced by the following method, for example. A polyimide of the present invention or a precursor varnish is first applied on a substrate on which a conductor layer having a given pattern has been formed, this is baked to obtain a polyimide resin layer acting as a interlayer insulation film. Then, patterning treatment using a photoresist, which is a known technology, is conducted to form a through hole in the polyimide resin layer, and a conductor layer is further formed on this to produce a two-layer wiring substrate electrically connected via a through hole part. This operation can be repeated may times to produce a multi-layer wiring substrate.

The present invention is illustrated by examples further in detail below, but these examples do not limit the scope of the present invention. Various tests in examples were carried out according to the following methods.
(1) Logarithmic Viscosity of Polyimide Powder and Polyamic Acid Varnish 0.50 g of a polyimide powder or 2.50 g of polyamic acid varnish (20 wt %) is dissolved in 100 ml of N-methyl-2-pyrrolidone, then, the logarithmic viscosity is measured at 35° C.

(2) 5% Weight Reduction Temperature

The 5% weight reduction temperature is measured at a temperature raising rate of 10° C./min. using DTA-TG (TG-DTA2000 manufactured by Mack Science) in air.
(3) Glass Transition Temperature-Crystal Melting Temperature The glass transition temperature or crystal melting temperature is measured at a temperature raising rate of 10° C./min. by a differential scanning calorimeter (DSC, DSC3100 manufactured by Mack Science).
(4) Solvent Solubility Test A polyimide powder is added into a each solvent so as to give a concentration of 20 wt %, the solution is stirred, and dissolution condition is recognized visually.
(5) Dielectric Constant The dielectric constant is evaluated according to JIS-K6911.
(6) Mechanical Properties of Film The mechanical properties of a film (tensile strength, elongation and tensile elastic modulus) are evaluated according to ASTM-D882.

Synthesis Example

Into a reaction flask equipped with a stirrer, thermometer and cooling tube was charged 300 g (2.82 mol) of m-xylene, cooled to −15° C., and 165 g (1.56 mol) of 93% sulfuric acid was added dropwise. To this was added a mixture of 68 g (100 mol) of isoprene and 150 g (1.41 mol) of m-xylene dropwise while keeping the reaction temperature around −10° C. over 7 hours, and further, the mixture was stirred for 1 hour at the same temperature. After completion of the reaction, the sulfuric acid layer was allowed to stand to be separated, and 300 g of a 20% saline solution was added to the organic layer, and the resulted mixture was neutralized with ammonia water. This was heated to 70 to 80° C. and the aqueous layer was separated, then, excess m-xylene was distilled off under reduced pressure. The resulted residue was distilled off under reduced pressure to obtain 1,1,4,6-tetramethylindan in the form of colorless liquid. The yielded amount was 120 g (yield: 69%), and the boiling point was 105 to 106° C. (2128 Pa).

$^1$H-NMR (CDCl$_3$, TMS) ppm δ 1.25 (6H, s, 1-Me×2) 1.90 (2H, t, 2-CH$_2$) 2.21 (3H, s, 4-Me or 6-Me) 2.31 (3H, s, 4-Me or 6-Me) 2.72 (2H, t, 3-CH$_2$) 6.77 (2H, s, 5-H and 7-H)

120 g (0.688 mol) of thus obtained 1,1,4,6-tetramethylindan was added dropwise into a mixed solvent having a specific gravity of 1.52 which had been previously cooled to −5° C. composed of 101 g (1.5 mol) of nitric acid, 417 g (4.17 mol) of 98% sulfuric acid and 300 g of 1,2-dichloroethane, while keeping the reaction temperature from −5° C. to 0° C., over 2 hours. After completion of addition, the mixture was further stirred for 1 hour at the same temperature. After completion of the reaction, 400 g of water was added to the reaction solution while cooling, to dilute the sulfuric acid layer, then, the organic layer was allowed to stand to be separated. 500 g of water was added to the separated organic layer, 1,2-dichloroethane was distilled azeotropically, and the precipitated crystal was filtrated, washed with water, and dried to obtain 5,7-dinitro-1,1,4,6-tetramethylindan as a pale yellow crystal. The yielded amount was 175 g (yield: 96%) and the melting point was from 91 to 93° C.

$^1$H-NMR (CDCl$_3$, TMS) ppm δ 1.38 (6H, s, 1-Me×2) 2.08 (2H, t, 2-CH$_2$) 2.20 (3H, s, 4-Me or 6-Me) 2.28 (3H, s, 4-Me or 6-Me) 3.87 (2H, t, 3-CH$_2$)

| Element analysis (%) | C | H | N |
|---|---|---|---|
| Calculated | 59.09 | 6.10 | 10.60 |
| Analyzed | 59.03 | 5.86 | 10.52 |

175 g (0.662 mol) of the resulted 5,7-dinitro-1,1,4,6-tetramethylindan was dissolved in 500 g of methanol, 17.5 g (50% water content) of 5%-Pd/C was added, then, the mixture was stirred for 84 hours at 50 to 60° C. under a hydrogen atmosphere. After completion of the reaction, the mixture was filtrated and filtrate was concentrated under reduced pressure. The resulted residue was distilled under reduced pressure to obtain 5,7-diamino-1,1,4,6-tetramethylindan as a pale yellow crystal. The yielded amount was 124 g (yield: 92.1%), the melting point was 77 to 78.5° C., and the boiling point was 148 to 150° C. (339 Pa).

$^1$H-NMR (CDCl$_3$, TMS) ppm δ 1.38 (6H, s, 1-Me×2) 1.86 (2H, t, 2-CH$_2$) 1.99 (3H, s, 4-Me or 6-Me) 2.03 (3H, s, 4-Me or 6-Me) 2.73 (2H, t, 3-CH$_2$) 3.3 to 3.5 (4H, br s, NH$_2$×2)

| Element analysis (%) | C | H | N |
|---|---|---|---|
| Calculated | 76.42 | 9.87 | 13.71 |
| Analyzed | 75.61 | 10.25 | 13.95 |

EXAMPLE 1

Into a five-necked reaction vessel equipped with a nitrogen introducing tube, thermometer, reflux cooling tube and stirring apparatus was charged 4.1 g (0.02 mol) of 5,7-diamino-1,1,4,6-tetramethylindan, 6.4 g (0.02 mol) of benzophenonetetracarboxylic dianhydride and 0.3 g (0.003 mol) of γ-picoline as a catalyst. To this was added 42 g of m-cresol and the mixture was stirred under a nitrogen atmosphere, heated up to 150° C. over 2 hours, then, reacted for 7 hours at 150° C. Water produced in the reaction was removed out of the system. The reaction solution was cooled to 30° C., and the resulted viscous polymer solution was discharged into 2 liter of methanol under vigorous stirring, to obtain a precipitate in the form of a yellow powder which was then filtrated. This filtrated substance was further washed with 30 ml of methanol and filtrated. This yellow powder was previously dried at 50° C. for 4 hours, then, dried at 220° C. for 4 hours under nitrogen flow.

The resulted polyimide powder had a logarithmic viscosity, glass transition temperature and 5% weight reduction temperature as described below.

Logarithmic viscosity: 0.53 dl/g

Glass transition temperature: not measured

5% weight reduction temperature: 429° C.

The structure of this yellow powder was identified by the following analyses.

$^1$H-NMR (CHCl$_3$): δ8.3 (2H, s), 8.3 (2H, s), 8.1 (2H, d, J=7.3 Hz), 2.9 (2H, br), 2.1 (3H, s), 2.0 (2H, br), 1.9 (3H, s), 1.2 (6H, s) Infrared absorption spectrum: 2956 cm$^{-1}$ (methylene C—H stretching), 1730 cm$^{-1}$ (imide C=O stretching), 1682 cm$^{-1}$ (conjugated C=O stretching), 1459 cm$^{-1}$ and 1425 cm$^{-1}$ (aromatic ring C—C stretching)

Further, the solvent solubility (20 wt %) of the resulted polyimide powder was checked, to find it can be dissolved into chloroform, N,N-dimethylacetamide, N-methyl-2-pyrrolidone, m-cresol, THF (tetrahydrofuran), cyclopentanone and the like.

Figure 2:
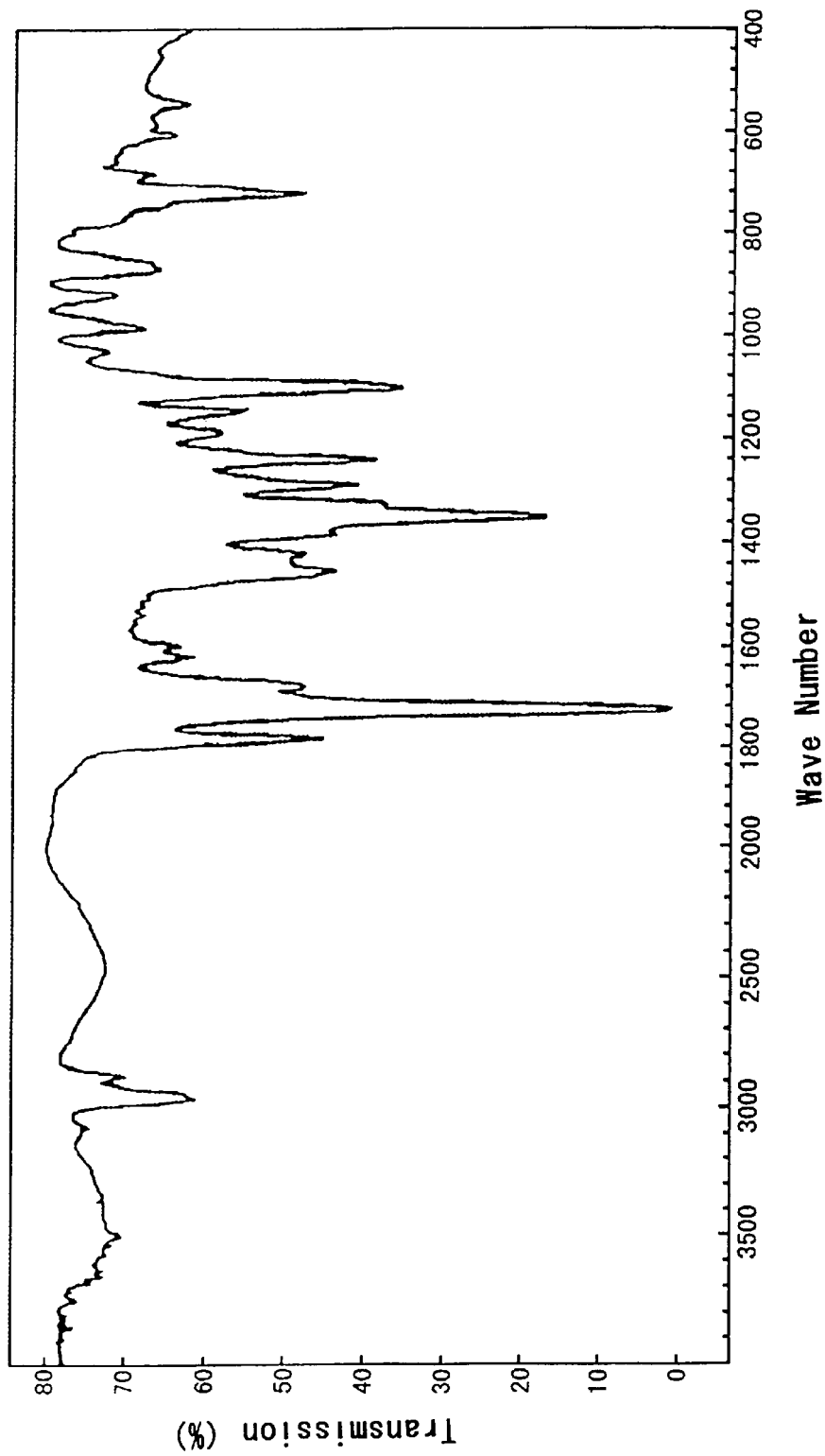
FIG. 2 shows an infrared absorption spectrum of a novel polyimide of Example 1.

FIG. 1 shows a $^1$H-NMR spectrum of the novel polyimide of this example. The abscissa shows chemical shift, and the ordinate axis shows strength. FIG. 2 shows an infrared absorption spectrum of the novel polyimide of the present invention. Here, the abscissa shows wave number (number of waves per unit length), and the ordinate axis shows transmission.

EXAMPLE 2

The polyimide powder obtained in Example 1 was dissolved in cyclopentanone to prepare a 20 wt % solution, which was applied on a copper plate. This was dried under nitrogen flow at 50° C. for 4 hours and 180° C. for 4 hours. The applied film thickness was 10 μm. This polyimide film was photo-masked, and irradiated with 365 nm (i beam) at 40 mJ/cm$^2$. This was treated with a developer, N,N-dimethylformamide, and dried at 50° C. for 30 minutes, to confirm formation of an image. The sensitivity (exposure amount to reach 50% of film thickness) was measured to know it was 22 mJ/cm$^2$.

EXAMPLE 3

Into a five-necked reaction vessel equipped with a nitrogen introducing tube, thermometer, reflux cooling tube and stirring apparatus was charged 4.086 g (0.02 mol) of 5,7-diamino-1,1,4,6-tetramethylindan, 6.316 g (0.0196 mol) of benzophenonetetracarboxylic dianhydride, 0.118 g (0.0008 mol) of phthalic anhydride as a terminator, 3.8 g (0.02 mol) of p-toluenesulfonic acid monohydrate as a catalyst and 1.6 g (0.02 mol) of pyridine. To this was added 50 g of N-methyl-2-pyrrolidone and 50 g of toluene and the mixture was stirred under a nitrogen atmosphere, heated up to 150° C. over 2 hours, then, reacted for 10 hours at 150° C. Water produced in the reaction was removed out of the system by toluene azeotropic distillation. The reaction solution was cooled to 30° C., and the resulted viscous polymer solution was discharged into 2 liter of methanol under vigorous stirring, to obtain a precipitate in the form of a yellow powder which was then filtrated. This filtrated substance was further washed with 100 ml of methanol and filtrated. This yellow powder was previously dried at 50° C. for 4 hours, then, dried at 220° C. for 4 hours under nitrogen flow. The resulted polyimide powder had a logarithmic viscosity, glass transition temperature and 5% weight reduction temperature as described below.

Logarithmic viscosity: 0.53 dl/g

Glass transition temperature: not measured

5% weight reduction temperature: 431° C.

The structure of this yellow powder was identified by the following analyses.

$^1$H-NMR (CHCl$_3$): δ8.3 (2H, s), 8.3 (2H, s), 8.1 (2H, d, J=7.3 Hz), 2.9 (2H, br), 2.1 (3H, s), 2.0 (2H, br), 1.9 (3H, s), 1.2 (6H, s) Infrared absorption spectrum: 2956 cm$^{-1}$ (methylene C—H stretching), 1730 cm$^{-1}$ (imide C=O stretching), 1682 cm$^{-1}$ (conjugated C=O stretching), 1459 cm$^{-1}$ and 1425 cm$^{-1}$ (aromatic ring C—C stretching)

Further, the solvent solubility (20 wt %) of the resulted polyimide powder was checked, to find it can be dissolved into chloroform, N,N-dimethylacetamide, N-methyl-2-pyrrolidone, m-cresol, THE, cyclopentanone and the like.

EXAMPLE 4

A polyimide film was produced by the same manner as in Example 2 using the polyimide powder obtained in Example 3, and the film was exposed and developed. The sensitivity was 31 mJ/cm$^2$.

COMPARATIVE EXAMPLE 1

8.12 g of a polyimide powder was obtained in the same manner as in Example 1 except that 3.29 g (0.02 mol) 2,3,5,6-tetramethyl-1,4-phenylenediamine and 6.32 g (0.0196 mol) of benzophenonetetracarboxylic dianhydride were used as raw materials and 0.12 g (0.0008 mol) of phthalic anhydride was a terminator was added before and after the reaction. This polyimide powder had a logarithmic viscosity of 0.88 dl/g. A polyimide film was produced by the same manner as in Example 2 using the resulted polyimide powder, and the film was exposed and developed. The sensitivity was 62 mJ/cm$^2$.

EXAMPLE 5

Into a five-necked reaction vessel equipped with a nitrogen introducing tube, thermometer, reflux cooling tube and stirring apparatus was charged 4.1 g (0.02 mol) of 5,7-diamino-1,1,4,6-tetramethylindan and 15 g of N-methyl-2-pyrrolidone and the mixture was stirred at room temperature under nitrogen atmosphere to dissolve them over 30 minutes. Into this reaction system was added 6.3 g (0.0195 mol) of benzophenonetetracarboxylic dianhydride quantitatively by 9 g of N-methyl-2-pyrrolidone. The mixture was stirred for 5 hours at room temperature under nitrogen atmosphere, then, 0.15 g (0.0010 mol) of phthalic anhydride as a terminator was added quantitatively by 7 g of N-methyl-2-pyrrolidone. The mixture was stirred at room temperature under nitrogen atmosphere for 2.5 hours, then, the reaction was terminated. The resulted polyamic acid varnish had a logarithmic viscosity of 0.26 dl/g.

EXAMPLE 6

The polyamic acid varnish obtained in Example 5 was applied on a glass plate. This was dried at 30° C. under nitrogen flow for 1 hour to obtain a polyamic acid film. Four pieces of this film were immersed for 60 seconds into N,N-dimethylacetamide, N-methyl-2-pyrrolidone, m-cresol and 2% tetramethylammonium hydroxide aqueous solution, respectively, to observe complete dissolution of all films. Further, this polyamic acid film was heated from 30° C. up to 250° C. under nitrogen flow over 2 hours, then, heated at 250° C. for 2 hours, to obtain a polyimide film having an applied film thickness of 10 μm.

EXAMPLE 7

Into a five-necked reaction vessel equipped with a nitrogen introducing tube, thermometer, reflux cooling tube and stirring apparatus was charged 4.086 g (0.02 mol) of 5,7-diamino-1,1,4,6-tetramethylindan, 8.36 g (0.0196 mol) of 4,4'-isophthaloyldiphthalic anhydride, 0.118 g (0.0004 mol) of phthalic anhydride as a terminator, 3.8 g (0.02 mol) of p-toluenesulfonic acid monohydrate as a catalyst and 1.6 g (0.02 mol) of pyridine. To this was added 50 g of N-methyl-2-pyrrolidone and 50 g of toluene and the mixture was stirred under a nitrogen atmosphere, heated up to 150° C. over 2 hours, then, reacted for 10 hours at 150° C. Water produced in the reaction was removed out of the system by toluene azeotropic distillation. The reaction solution was cooled to 30° C., and the resulted viscous polymer solution was discharged into 2 liter of methanol under vigorous stirring, to obtain a precipitate in the form of a yellow powder which was then filtrated. This filtrated substance was further washed with 100 ml of methanol and filtrated. This yellow powder was previously dried at 50° C. for 4 hours, then, dried at 220° C. for 4 hours under nitrogen flow. The resulted polyimide powder had a logarithmic viscosity, glass transition temperature and 5% weight reduction temperature as described below.

Logarithmic viscosity: 0.65 dl/g

Glass transition temperature: not measured

5% weight reduction temperature: 428° C.

Further, the solvent solubility (20 wt %) of the resulted polyimide powder was checked, to find it can be dissolved into chloroform, N,N-dimethylacetamide, N-methyl-2-pyrrolidone, m-cresol, THF, cyclopentanone and the like.

EXAMPLE 8

A polyimide film was produced, and exposed and developed by the same manner as in Example 2 except that the polyimide powder obtained in Example 7 was used and cyclopentanone was used as a developer. The sensitivity was 23 mJ/cm$^2$.

EXAMPLE 9

Into a five-necked reaction vessel equipped with a nitrogen introducing tube, thermometer, reflux cooling tube and stirring apparatus was charged 4.1 g (0.02 mol) of 5,7-diamino-1,1,4,6-tetramethylindan and 15 g of N-methyl-2-pyrrolidone and the mixture was stirred at room temperature under nitrogen atmosphere to dissolve them over 30 minutes. Into this reaction system was added 8.36 g (0.0196 mol) of 4,4'-isophthaloyldiphthalic anhydride quantitatively by 9 g of N-methyl-2-pyrrolidone. The mixture was stirred for 5 hours at room temperature under nitrogen atmosphere, then, 0.118 g (0.0004 mol) of phthalic anhydride as a terminator was added quantitatively by 7 g of N-methyl-2-pyrrolidone. The mixture was stirred at room temperature under nitrogen atmosphere for 2.5 hours, then, the reaction was terminated. The resulted polyamic acid varnish had a logarithmic viscosity of 0.37 dl/g.

EXAMPLE 10

Polyamic acid films were produced in the same manner as in Example 6 except that the polyamic acid varnish obtained in Example 9 was used, and immersed into the solvents, to observe complete dissolution of all films. Further, this polyamic acid film was heated in the same manner as in Example 6, to obtain a polyimide film having an applied film thickness of 10 μm.

EXAMPLE 11

Into a five-necked reaction vessel equipped with a nitrogen introducing tube, thermometer, reflux cooling tube and stirring apparatus was charged 4.086 g (0.02 mol) of 5,7-diamino-1,1,4,6-tetramethylindan, 0.691 g (0.00196 mol) of 2,3,6,7-thioxanetonetetracarboxylic dianhydride, 5.684 g (0.01764 mol) of benzophenonetetracarboxylic dianhydride, 0.118 g (0.0004 mol) of phthalic anhydride as a terminator, 3.8 g (0.02 mol) of p-toluenesulfonic acid monohydrate as a catalyst and 1.6 g (0.02 mol) of pyridine. To this was added 50 g of N-methyl-2-pyrrolidone and 50 g of toluene and the mixture was stirred under a nitrogen atmosphere, heated up to 150° C. over 2 hours, then, reacted for 10 hours at 150° C. Water produced in the reaction was removed out of the system by toluene azeotropic distillation. The reaction solution was cooled to 30° C., and the resulted viscous polymer solution was discharged into 2 liter of methanol under vigorous stirring, to obtain a precipitate in the form of a yellow powder which was then filtrated. This filtrated substance was further washed with 100 ml of methanol and filtrated. This yellow powder was previously dried at 50° C. for 4 hours, then, dried at 220° C. for 4 hours under nitrogen flow. The resulted polyimide powder had a logarithmic viscosity, glass transition temperature and 5% weight reduction temperature as described below.

Logarithmic viscosity: 0.62 dl/g

Glass transition temperature: not measured

5% weight reduction temperature: 420° C.

Further, the solvent solubility (20 wt %) of the resuited polyimide powder was checked, to find it can be dissolved into chloroform, N,N-dimethylacetamide, N-methyl-2-pyrrolidone, m-cresol, THF, cyclopentanone and the like.

EXAMPLE 12

A polyimide film was produced, and exposed and developed by the same manner as in Example 2 except that the polyimide powder obtained in Example 11 was used and cyclopentanone was used as a developer. The sensitivity was 20 mJ/cm$^2$.

EXAMPLE 13

Into a five-necked reaction vessel equipped with a nitrogen introducing tube, thermometer, reflux cooling tube and stirring apparatus was charged 4.1 g (0.02 mol) of 5,7-diamino-1,1,4,6-tetramethylindan and 15 g of N-methyl-2-pyrrolidone and the mixture was stirred at room temperature under nitrogen atmosphere to dissolve them over 30 minutes. Into this reaction system was added 0.691 g (0.00196 mol) of 2,3,6,7-thioxanetonetetracarboxylic dianhydride and 5.684 g (0.01764 mol) of benzophenonetetracarboxylic dianhydride quantitatively by 9 g of N-methyl-2-pyrrolidone. The mixture was stirred for 5 hours at room temperature under nitrogen atmosphere, then, 0.118 g (0.0004 mol) of phthalic anhydride as a terminator was added quantitatively by 7 g of N-methyl-2-pyrrolidone. The mixture was stirred at room temperature under nitrogen atmosphere for 2.5 hours, then, the reaction was terminated. The resulted polyamic acid varnish had a logarithmic viscosity of 0.36 dl/g.

EXAMPLE 14

Polyamic acid films were produced in the same manner as in Example 6 except that the polyamic acid varnish obtained in Example 13 was used, and immersed into the solvents, to observe complete dissolution of all films. Further, this polyamic acid film was heated in the same manner as in Example 6, to obtain a polyimide film having an applied film thickness of 10 μm.

EXAMPLE 15

Theoretical Calculation: Calculation Examples 1 to 7

A molecular model of A, B or C represented by the following formula (IX) was produced using a molecular modeling soft (CS Chem3D pro). Regarding this molecular model, optimization was conducted using semi-empirical molecular orbital calculation (AM1), to obtain an optimal stabilized structure. In this structure, the absolute value |α| of the dihedral angle α was checked and the results are summarized in Table 1.

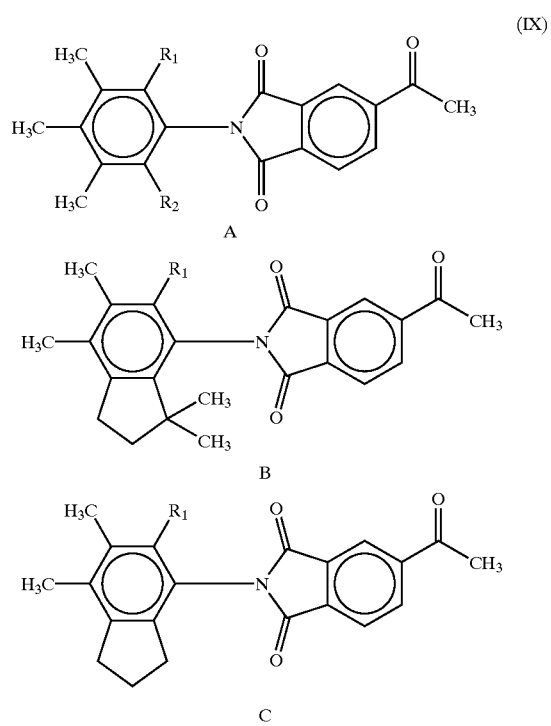

(IX)

TABLE 1

| | Model compound | R$_1$ | R$_2$ | Dihedral angle α |
|---|---|---|---|---|
| Calculation Example 1 | C | CH$_3$ | — | 65 |
| Calculation Example 2 | A | CH$_3$ | CH$_3$ | 71 |
| Calculation Example 3 | A | CH$_3$ | Et | 81 |
| Calculation Example 4 | A | CH$_3$ | Ph | 84 |
| Calculation Example 5 | A | CH$_3$ | iso-Pr | 85 |
| Calculation Example 6 | B | CH$_3$ | — | 89 |

In Table 1, a model corresponding to the polyimide of the present invention is Calculation Example 6, and in this model, the dihedral angle is largest. Namely, it was proved also by calculation that the polyimide of the present invention is controlled by a steric structure having large dihedral angle. This result theoretically explains that the characteristic structure of the polyimide of the present invention suppresses intramolecular charge transfer, and attains increase in photosensitive ability.

EXAMPLE 16

Into a five-necked reaction vessel equipped with a nitrogen introducing tube, thermometer, Deanstark tube with a reflux cooling tube and stirring apparatus was charged 1.02 g (0.05 mol) of 5,7-diamino-1,1,4,6-tetramethylindan, 10.8 g (0.0495 mol) of pyromellitic dianhydride, 0.148 g (0.001 mol) of phthalic anhydride, 4.0 g (0.05 mol) of pyridine and 9.5 g (0.05 mol) of p-toluenesulfonic acid monohydrate. To this was added 70 g of N-methyl-2-pyrrolidone and 70 g of toluene and the mixture was stirred under a nitrogen atmosphere, heated up to the reflux temperature 135° C. over 2 hours, then, reacted for 8 hours. Water produced in the reaction was removed out of the system. Then, the reaction solution was cooled to 30° C., and the resulted viscous polymer solution was discharged into 2 liter of methanol under vigorous stirring, to obtain a precipitate in the form of a brown powder which was then filtrated. This filtrated substance was further washed with 100 ml of methanol and filtrated. This brown powder was previously dried at 50° C. for 4 hours, then, dried at 220° C. for 4 hours under nitrogen flow. The resulted polyimide powder had a logarithmic viscosity, glass transition temperature and 5% weight reduction temperature as described below.

Logarithmic viscosity: 0.46 dl/g

Glass transition temperature: not measured

5% weight reduction temperature: 422° C.

Further, the solvent solubility (20 wt %) of the resulted polyimide powder was checked, to find it can be dissolved into chloroform, N-methyl-2-pyrrolidone, m-cresol, THF, cyclopentanone and the like.

EXAMPLE 17

The same treatment was conducted as in Example 1 except that the pyromellitic anhydride in Example 16 was substituted with 14.6 g (0.0495 mol) of 3,3',4,4'-biphenyltetracarboxylic dianhydride. The resulted pale yellow polyimide powder had a logarithmic viscosity, glass transition temperature and 5% weight reduction temperature as described below.

Logarithmic viscosity: 0.96 dl/g

Glass transition temperature: not measured

5% weight reduction temperature: 431° C.

Further, the solvent solubility (20 wt %) of the resuited polyimide powder was checked, to find it can be dissolved into chloroform, N-methyl-2-pyrrolidone, m-cresol, THF, cyclopentanone and the like.

EXAMPLE 18

The same treatment was conducted as in Example 1 except that the pyromellitic anhydride in Example 16 was substituted with 15.4 g (0.0495 mol) of bis(3,4-dicarboxyphenyl) ether dianhydride. The resulted pale yellow polyimide powder had a logarithmic viscosity, glass transition temperature and 5% weight reduction temperature as described below.

Logarithmic viscosity: 0.66 dl/g

Glass transition temperature: not measured

5% weight reduction temperature: 429° C.

Further, the solvent solubility (20 wt %) of the resulted polyimide powder was checked, to find it can be dissolved into chloroform, N-methyl-2-pyrrolidone, m-cresol, THF, cyclopentanone and the like.

EXAMPLE 19

The same treatment was conducted as in Example 1 except that the pyromellitic anhydride in Example 16 was substituted with 17.7 g (0.0495 mol) of bis(3,4-dicarboxyphenyl) sulfone dianhydride. The resulted pale yellow polyimide powder had a logarithmic viscosity, glass transition temperature and 5% weight reduction temperature as described below.

Logarithmic viscosity: 0.38 dl/g

Glass transition temperature: not measured

5% weight reduction temperature: 422° C.

Further, the solvent solubility (20 wt %) of the resulted polyimide powder was checked, to find it can be dissolved into chloroform, N-methyl-2-pyrrolidone, m-cresol, THF, cyclopentanone and the like.

EXAMPLE 20

Into a five-necked reaction vessel equipped with a nitrogen introducing tube, thermometer, Deanstark tube with a reflux cooling tube and stirring apparatus was charged 1.02 g (0.05 mol) of 5,7-diamino-1,1,4,6-tetramethylindan, 22.0 g (0.0495 mol) of 2,2-bis(3,4-dicarboxyphenyl)-1,1,1,3,3,3-hexafluoropropane dianhydride, 0.148 g (0.001 mol) of phthalic anhydride, 4.0 g (0.05 mol) of pyridine and 9.5 g (0.05 mol) of p-toluenesulfonic acid monohydrate. To this was added 70 g of N-methyl-2-pyrrolidone and 70 g of toluene and the mixture was stirred under a nitrogen atmosphere, heated up to the reflux temperature 135° C. over 2 hours, then, reacted for 8 hours. Water produced in the reaction was removed out of the system. Then, the reaction solution was cooled to 30° C., and the resulted viscous polymer solution was discharged into 2 liter of methanol under vigorous stirring, to obtain a precipitate in the form of a pale yellow powder which was then filtrated. This filtrated substance was further washed with 100 ml of methanol and filtrated. This pale yellow powder was previously dried at 50° C. for 4 hours, then, dried at 220° C. for 4 hours under nitrogen flow. The resulted pale yellow polyimide powder had a logarithmic viscosity, glass transition temperature and 5% weight reduction temperature as described below.

Logarithmic viscosity: 0.56 dl/g

Glass transition temperature: not measured

5% weight reduction temperature: 436° C.

Further, the solvent solubility (20 wt %) of the resulted polyimide powder was checked, to find it can be dissolved into chloroform, N-methyl-2-pyrrolidone, m-cresol, THF, cyclopentanone, ethyl acetate, acetone and the like.

This polyimide powder was dissolved in dimethylacetamide to prepared varnish having a concentration of 20 wt %, this was applied on a glass plate, and this was dried under nitrogen flow at 180° C. for 4 hours, subsequently under reduced pressure at 100° C. for 8 hours, further under reduced pressure at 180° C. for 16 hours, to obtain a polyimide film having a thickness of 16 µm. The dielectric constant ($\epsilon$) of this film was measured to find it was 2.68. According to the same operation as described above, a polyimide film having a thickness of 60 µm was produced, and mechanical properties of this film were measured, to find a tensile strength of 68.0 MPa, a tensile elastic modulus of 2.3 GPa, and an elongation of 5%.

As described above, the present invention can provide at low cost a novel polyimide and polyamic acid excellent in heat resistance, mechanical properties, adhesion property, and additionally manifesting high solvent solubility and low dielectric property, or photosensitivity of high sensitivity and high resolution. These are extremely useful particularly in use of a photoresist exposed to 365 nm (i beam), further, in use of insulation films, particularly, highly integrated semiconductor apparatuses and highly integrated multi-layer wiring substrates containing an insulation film as a surface protective film and an interlayer insulation film.

What is claimed is:

1. A polyimide having a repeating unit of the following general formula (I):

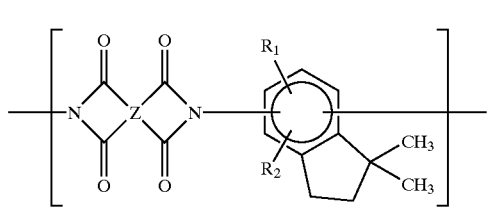 (I)

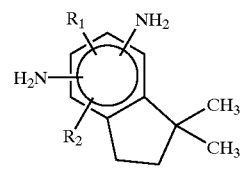 (II)

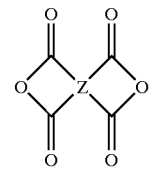 (III)

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

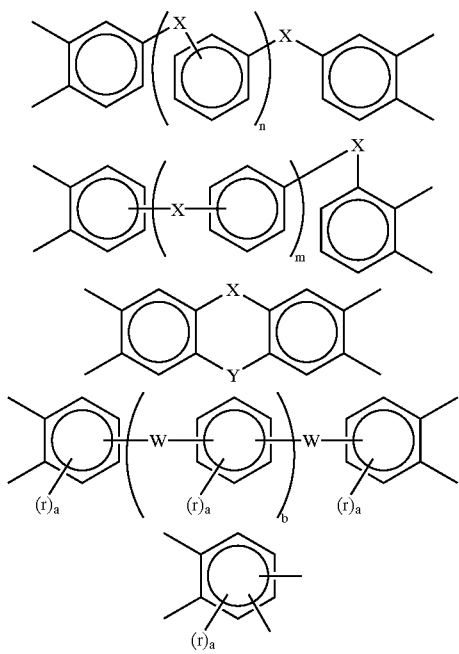

wherein, X represents —CO— or —C(=N$_2$)—, Y represents a direct bond, —CH$_2$—, —O—, —SO$_2$—, —S—, —CO— or —C(=N$_2$)—, and W represents a direct bond, —CH$_2$—, —C(CH$_3$)$_2$—, —C(CF$_3$)$_2$—, —S—, —SO—, —SO$_2$— or —O—, b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3).

2. The polyimide according to claim 1 wherein both of $R_1$ and $R_2$ are a methyl group, and these methyl groups are bonded to 4- and 6-positions on a 1,1-dimethylindan skeleton in the general formula (I).

3. A method of producing a polyimide having a repeating unit of the following general formula (I) wherein the method uses a diaminoindan derivative of the following general formula (II) and an aromatic tetracarboxylic dianhydride of the following general formula (III) as monomers

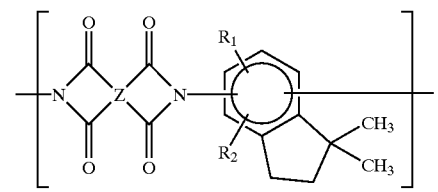 (I)

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

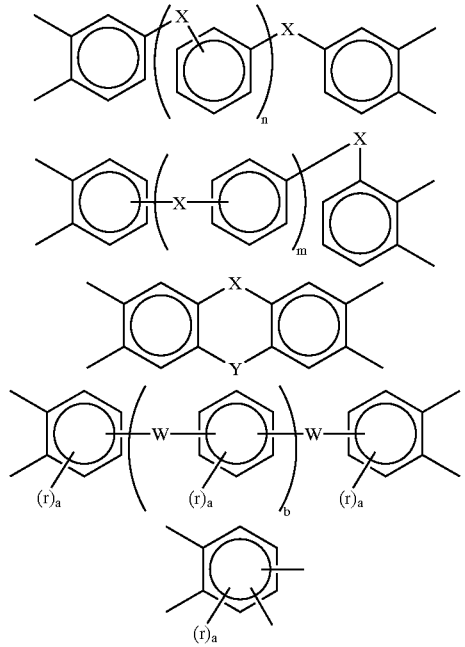

wherein, X represents —CO— or —C(=N$_2$)—, Y represents a direct bond, —CH$_2$—, —O—, —SO$_2$—, —S—, —CO— or —C(=N$_2$)—, and W represents a direct bond, —CH$_2$—, —C(CH$_3$)$_2$—, —C(CF$_3$)$_2$—, —S—, —SO—, —SO$_2$— or —O—, b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3).

4. The method of producing a polyimide according to claim 3 wherein both of $R_1$ and $R_2$ are a methyl group, and these methyl groups are bonded to 4- and 6-positions on a 1,1-dimethylindan skeleton in the general formula (I) and (II).

5. A polyamic acid having a repeating unit of the following general formula (IV):

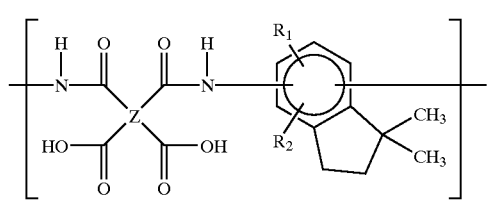

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

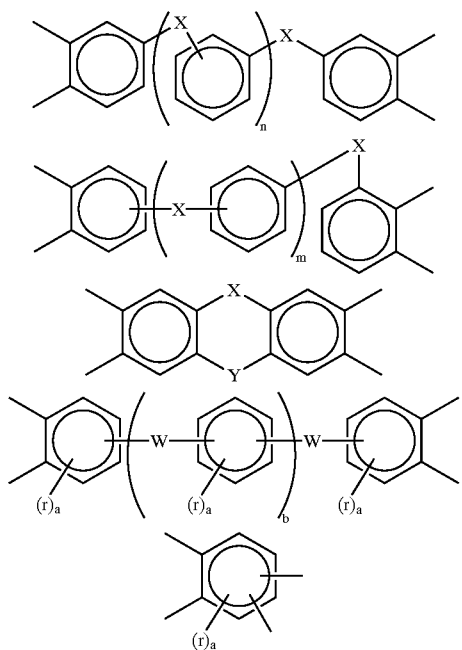

wherein, X represents —CO— or —C(=N$_2$)—, Y represents a direct bond, —CH$_2$—, —O—, —SO$_2$—, —S—, —CO— or —C(=N$_2$)—, and W represents a direct bond, —CH$_2$—, —C(CH$_3$)$_2$—, —C(CF$_3$)$_2$—, —S—, —SO—, —SO$_2$— or —O—, b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3).

6. The polyamic acid according to claim 5 wherein both of $R_1$ and $R_2$ are a methyl group, and these methyl groups are bonded to 4- and 6-positions on a 1,1-dimethylindan skeleton in the general formula (IV).

7. A method of producing a polyamic acid having a repeating unit of the following general formula (IV) wherein the method uses a diaminoindan derivative of the following general formula (II) and an aromatic tetracarboxylic dianhydride of the following general formula (III) as monomers

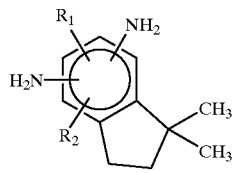

(II)

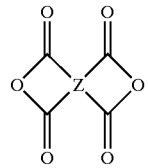

(III)

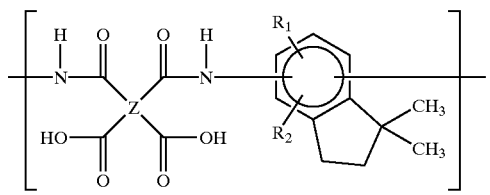

(IV)

(wherein, $R_1$ and $R_2$ each independently represent a hydrogen atom or an alkyl group having 1 to 20 carbon atoms, and Z represents a condensed polycyclic aromatic group or at least one group selected from the group consisting of the following formulae:

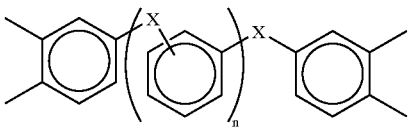

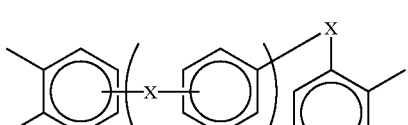

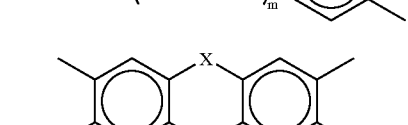

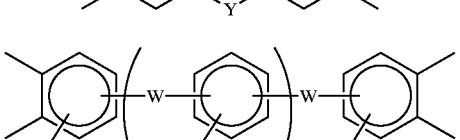

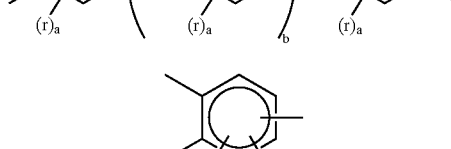

wherein, X represents —CO— or —C(=N$_2$)—, Y represents a direct bond, —CH$_2$—, —O—, —SO$_2$—, —S—, —CO— or —C(=N$_2$)—, and W represents a direct bond, —CH$_2$—, —C(CH$_3$)$_2$—, —C(CF$_3$)$_2$—, —S—, —SO—, —SO$_2$— or —O—, b represents an integer of 0 or 1, m and n each independently represent an integer of 0 or 1, r each independently represents an alkyl group having 1 to 4 carbon atoms or a halogen or a phenyl group, and a represents an integer of 0 or 1 to 3).

8. The method of producing a polyamic acid according to claim 7 wherein both of $R_1$ and $R_2$ are a methyl group, and these methyl groups are bonded to 4- and 6-positions on a 1,1-dimethylindan skeleton in the general formula (IV) and (II).

9. A photoresist containing a polyimide according to claim 1.

10. A photoresist containing a polyamic acid according to claim 5.

11. An insulation film composed of a polyimide according to claim 1 wherein Z is

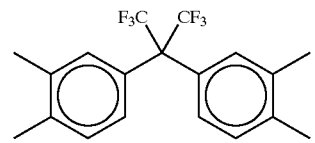

in the general formula (I).

12. A multi-layer wiring substrate having an insulation film according to claim 10 as an interlayer insulation film.

* * * * *